United States Patent [19]

Choi et al.

[11] Patent Number: 5,870,435
[45] Date of Patent: Feb. 9, 1999

[54] QUANTIZATION/INVERSE QUANTIZATION UNIT SELECTABLY ACCOMMODATING MULTIPLE VIDEO ENCODING STANDARDS AND INCLUDING DIFFERENTIAL PULSE CODE MODULATOR

[75] Inventors: Jang-Sik Choi; Byoung-Ki Min; Sang-Beom Kim; Seung-Ku Hwang, all of Daejeon, Rep. of Korea

[73] Assignee: Electronics and Telecommunications Research Institute, Daejeon, Rep. of Korea

[21] Appl. No.: 840,642

[22] Filed: Apr. 25, 1997

[30] Foreign Application Priority Data

Dec. 9, 1996 [KR] Rep. of Korea ............... 1996 63149

[51] Int. Cl.⁶ ............... G06K 9/38; H04B 14/04; H04N 7/42; H03M 3/04
[52] U.S. Cl. ............... 375/245; 341/200; 348/405; 348/410; 382/251
[58] Field of Search ............... 375/240–242, 375/244, 245; 370/477; 341/76, 87, 200; 348/400, 403–405, 409, 410, 420, 472; 382/248, 250, 251; 358/432, 433; 386/33, 34, 109, 112

[56] References Cited

U.S. PATENT DOCUMENTS

| | | | |
|---|---|---|---|
| 4,491,953 | 1/1985 | Bellisio et al. ............... | 375/246 |
| 5,073,820 | 12/1991 | Nakagawa et al. ............... | 348/405 |
| 5,283,646 | 2/1994 | Bruder ............... | 348/415 |
| 5,295,077 | 3/1994 | Fukuoka ............... | 358/479 |
| 5,530,478 | 6/1996 | Sasaki et al. ............... | 348/405 |
| 5,614,946 | 3/1997 | Fukuoka ............... | 348/232 |

*Primary Examiner*—Stephen Chin
*Assistant Examiner*—Jeffrey W. Gluck
*Attorney, Agent, or Firm*—Antonelli, Terry, Stout & Kraus, LLP

[57] ABSTRACT

Disclosed is a quantization/inverse quantization circuit including a differential pulse code modulator (DPCM). Video CODEC standards (i.e., JPEG, H.261, H.263, MPEG-1, and MPEG-2) include various functions for an image compression and an image reconstruction. The conventional quantization/inverse quantization circuit has been designed to be fit for only one desired standard, so that the quantization/inverse quantization circuit used for one standard cannot be directly used for another standard. Accordingly, in relation to a difference between standards and required function therebetween in order to use the present invention in all video CODEC standards, the present invention discloses a quantization/inverse quantization circuit which can support all modes (i.e., a quantization mode in coding, an inverse quantization mode in decoding, and a reconstruction mode) by employing one quantization circuit as a quantization/inverse quantization circuit which can be used in all video CODEC standards.

4 Claims, 4 Drawing Sheets

QUANTIZATION/INVERSE QUANTIZATION UNIT SELECTABLY ACCOMMODATING MULTIPLE VIDEO ENCODING STANDARDS AND INCLUDING DIFFERENTIAL PULSE CODE MODULATOR

BACKGROUND OF THE INVENTION

1. Field of the Invention

The present invention generally relates to a quantization/inverse quantization circuit including a differential pulse code modulator (hereinafter referred to as a DPCM) which can be used in all video coder-decoder (hereinafter referred to as a CODEC) standards (i.e., JPEG, H.261, H.263, MPEG-1, and MPEG-2). More particularly, it relates to a quantization/inverse quantization circuit which can support a quantization/inverse quantization function suitable to a desired standard according to a process mode.

2. Description of the Conventional Art

The present invention relates to techniques of a quantization circuit used for video CODEC standards (JPEG, H.261, H.263, MPEG-1, and MPEG-2). The quantization of the video CODEC divides a discrete cosine transform (hereinafter referred to as a DCT) coefficient into quantization gaps by a quantization matrix, and then rounds it off to an integer value. On the contrary, an inverse quantization step multiplies a quantized value by a quantizer scale. A division step does not use a divider in the quantization step, but the division step uses an inverse number of a divisor and multiplies the inverse number. As a result, quantization and inverse quantization are achieved by using only a multiplier without using an additional divider. The quantization circuit is selected for all video CODEC standards and employed.

Since a conventional quantization/inverse quantization circuit is suitable to only one standard, it could not be used for other standards. Furthermore, to achieve a reconstruction mode processing, an additional inverse quantization circuit in addition to the quantization/inverse quantization circuit is needed, thereby requiring more hardware area. In addition, the conventional art does not include DPCM, so that it additionally includes an independent DPCM at its external part.

SUMMARY OF THE INVENTION

Accordingly, the present invention is directed to a quantization/inverse quantization circuit including a DPCM that substantially obviates one or more of the problems due to limitations and disadvantages of the conventional art.

It is an object of the present invention to provide a quantization/inverse quantization circuit including a DPCM in video CODEC standards (JPEG, H.261, H.263, MPEG-1, and MPEG-2), which analyzes a point of sameness and a point of difference among the video CODEC standards, thereby using minimum hardware.

To achieve the above object, the quantization/inverse quantization circuit having a DPCM in a video CODEC according to the present invention, includes: an internal direct current (hereinafter referred to as a DC) processor which detects that the number '128' is converted to '255' in the inverse quantization of the video CODEC standards (H.261 and H.263) and then reconstructs an original number, or directly passes through other modes without any conversion, in order to quantize a DCT result in video CODEC standards (JPEG, H.261, H.263, MPEG-1, and MPEG-2), to inverse quantize a DPCM result and to inverse quantize again the quantized result; a Booth coded additive circuit which generates an input value of three bits necessary to a multiplier in order to perform a three-bit multiplication; a Booth multiplier which actually performs a multiplication and a division in quantization/inverse quantization; a mismatch control circuit which is needed in the video CODEC standard MPEG-2; and a DPCM path control circuit which obtains a DC value's difference between blocks with respect to a DC component of a block, and includes a selecting means for selecting an input according to a process mode.

The present invention is a quantization/inverse quantization circuit which can be used in all video CODEC standards. The present invention supports all modes (i.e., a quantization mode in coding, an inverse quantization mode in decoding, and a reconstruction mode) by employing one quantization circuit.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus do not limit the present invention, and wherein.

DETAILED DESCRIPTION OF THE INVENTION

The preferred embodiment of the present invention will become apparent from a study of the following detailed description, when viewed in light of the accompanying drawings.

Figure 1:
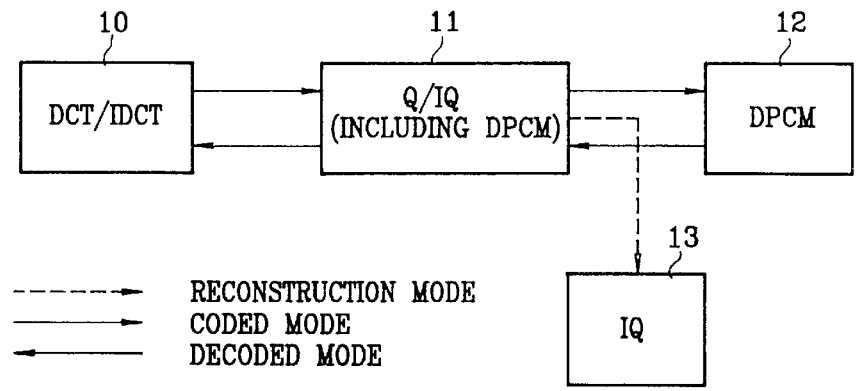
FIG. 1 is a block diagram for explaining a step wherein a quantization is performed in a video CODEC according to the present invention.

Referring to FIG. 1, when coding in the video CODEC standard JPEG, data are transmitted to a discrete cosine transform/inverse discrete cosine transform (hereinafter referred to as a DCT/IDCT) portion 10–>a quantization/inverse quantization (hereinafter referred to as a Q/IQ)

portion 11->a DPCM portion 12. Namely, the data transmission path is DCT/IDCT portion 10->Q/IQ portion 11->DPCM portion 12. On the contrary, when decoding in the video CODEC standard JPEG, a data transmission path is opposite to the aforementioned path. However, other video CODEC standards (H.261, H.263, MPEG-1, and MPEG-2) excepting JPEG should support a reconstruction mode as well as coding and decoding modes such as the JPEG. In the reconstruction mode, an operation sequence is DCT/IDCT portion 10->Q/IQ portion 11->an inverse quantization (hereinafter referred to as an IQ) portion 13, in which a private IQ circuit is necessary for this reconstruction mode.

One block of information is divided into a DC component and an alternating current (hereinafter referred to as an AC) component. The DC component indicates the first pixel in an 8×8 block, and remaining pixels corresponds to the AC component. The DPCM computes a difference between DC value of a current block and DC value of a previous block, and only transmits the difference value, thereby reducing a transmission bit quantity.

Figure 2:
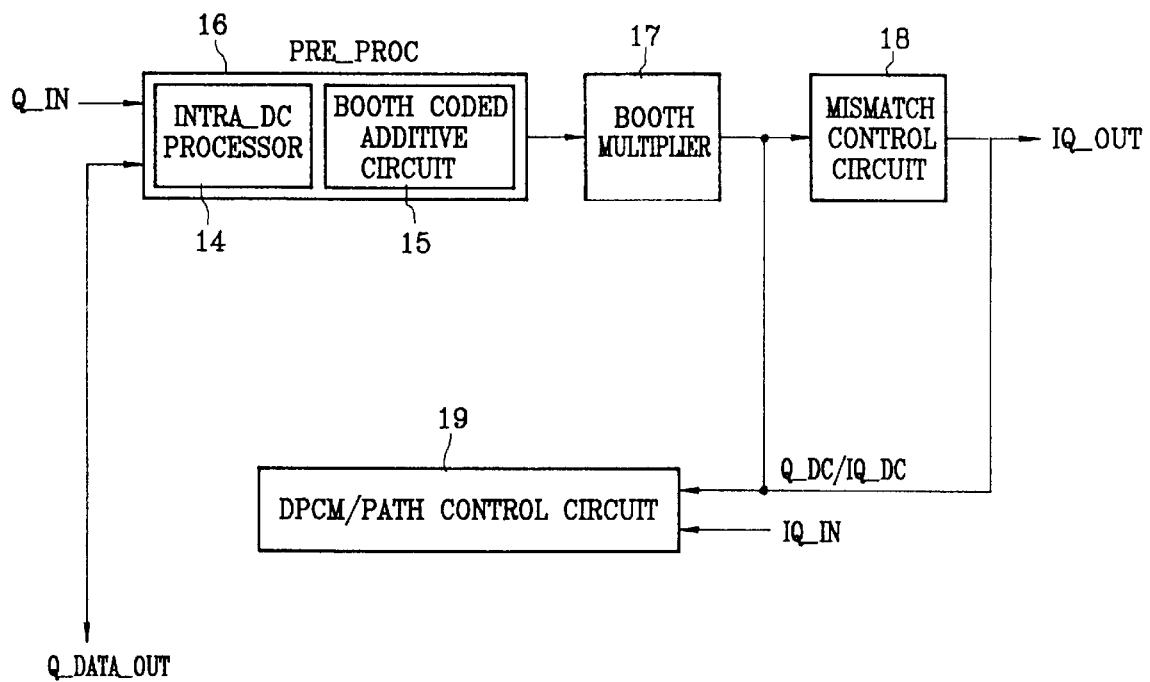
FIG. 2 is a block diagram of a quantization/inverse quantization circuit including a DPCM according to the present invention.

As shown in FIG. 2, internal structural elements of the present invention comprise: a mismatch control circuit 18 needed in the video CODEC standard MPEG-2; a DPCM path control circuit 19 which performs a differential pulse code modulation about one block DC component; an internal DC processor 14 for the video CODEC standards H.261 and H.263; Booth multiplier 17 for actually performing a multiplication; and Booth coded additive circuit 15 for applying an input bit string to the Booth multiplier 17.

These internal elements are necessary to perform a Q/IQ including DPCM of video CODEC standards (JPEG, H.261, H.263, MPEG-1, and MPEG-2).

The internal DC processor 14 for video CODEC standards H.261 and H.263 will now be described with reference to FIG. 2.

A fixed length code (FLC) for an internal mode (INTRA_MODE) DC coefficient of the video CODEC standards H.261 and H.263 ranges from 1(00000001) to 254 (11111110). Normally, a bit string is 10000000 in case of a decimal number '128'. However, this bit string (10000000) is used as another code information in video CODEC standards H.261 and H.263; therefore, a decimal number 255(11111111) is used on behalf of the decimal number '128'. Accordingly, the number '255' should be first detected, converted to the number '128', and inputted to a quantizer. The above processes are achieved in the internal DC (INTRA_DC) processor 14.

Figure 3:
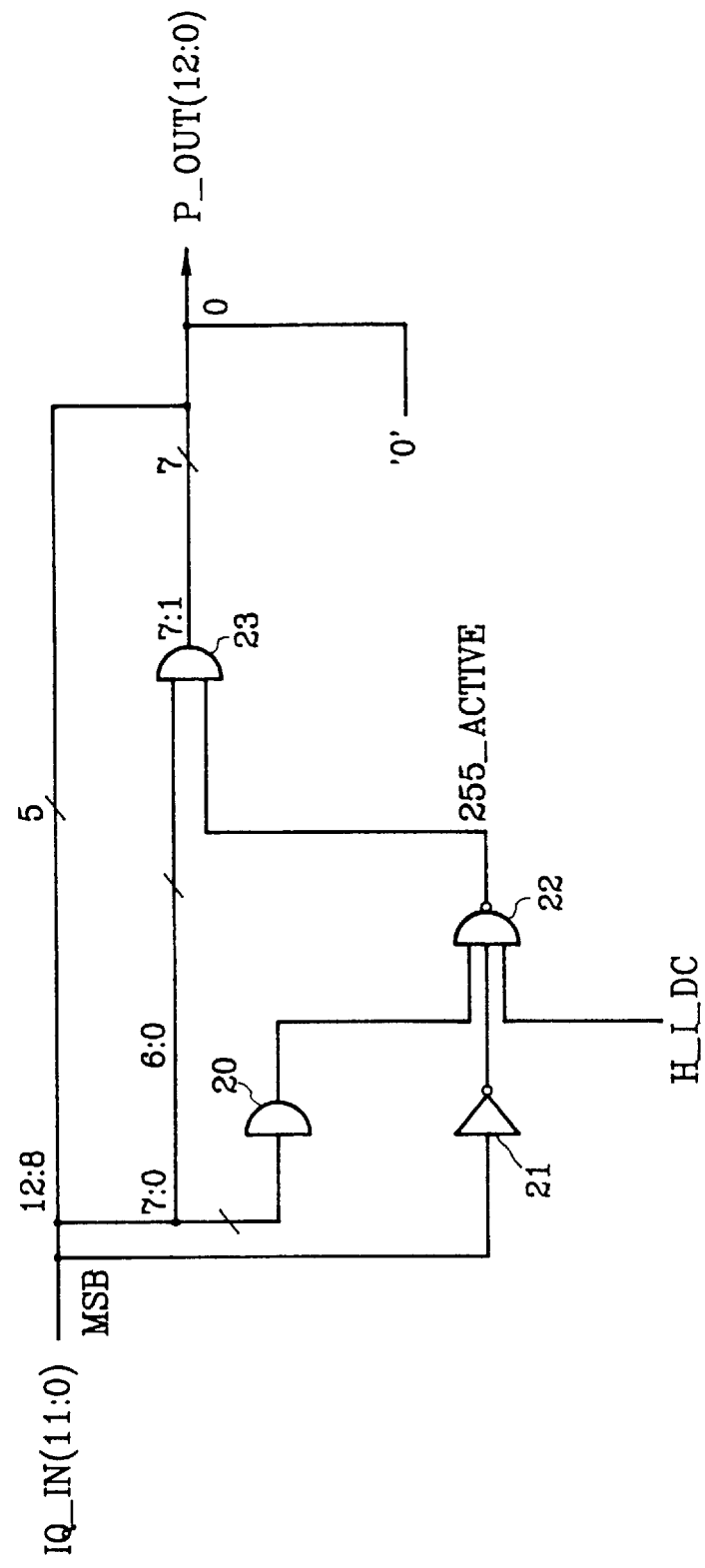
FIG. 3 is a circuit diagram of an internal DC (INTRA DC) processor for video CODEC standards (H.261 and H.263) according to the present invention.

The internal DC (INTRA_DC) processor 14 is shown in FIG. 3. 8-bit AND gate 20 of FIG. 3 checks whether input value IQ_IN is checked. The inverter INV 21 detects whether the input value IQ_IN is positive or negative. Through a signal H_I_DC showing the internal DC (INTRA_DC) process mode of video CODEC standards H.261 and H.263, AND gate 20, and inverter 21, a 255_ACTIVE signal for converting '255'to '128'is generated in NAND gate 22. 7-bit AND gate 23 for inverting low order 7 bits is operated by the 255_ACTIVE signal. However, in the remaining modes excepting the internal DC (INTRA_DC) process mode of video CODEC standards H.261 and H.263, the input IQ_IN directly passes through the internal DC (INTRA_DC) processor 14.

The Booth multiplier 17 shown in FIG. 2 multiplies a multiplicand from a PRE_PROC portion 16 by a multiplier within the Booth multiplier 17. The inverse quantization step of video CODEC standard MPEG among several standards requires the following equation 1 with respect to integer A and positive integer Q.

$$D=Q\times[2\times A+\text{Sign}(A)] \qquad \text{[Equation 1]}$$

if A>0, Sign(A)=1
if A=0, Sign(A)=0
if A<0, Sign(A)=−1

Here, D represent a value of a datum.

To embody the above Equation 1, the following two steps Eqs.2 and 3 should be calculated in general, and a parallel adder and a multiplier are needed.

$$C=2\times A+\text{Sign}(A) \qquad \text{[Equation 2]}$$

$$D=Q\times C \qquad \text{[Equation 3]}$$

A range of value A is −255~255 in video CODEC standard MPEG-2, and a range of a value Q is limited to the multiplied values between positive numbers 1~255 and 1~31, whereby the present invention is limited thereto. However, the value A is generalized as the n-bit two's complement A of which range is $-2^{n-1}+1\sim 2^{n-1}-1$, and the value Q is also generalized as the m-bit binary number Q, whose range is $1\sim 2^{m-1}$, so that the values A and Q can be readily applied to the present invention.

The multiplier is a Booth multiplier. When there are n-bit multiplier C and m-bit multiplicand Q, instead of the multiplication being, embodied by the summing operation of n times, the Booth multiplier reduces the number of the summing operations by n/2, n/3 and the like, thereby improving an operating speed and complexity of the multiplier.

In order to not use a parallel adder, the present invention performs a multiplication by using both Booth coded additive circuit 15 and Booth multiplier 17.

Generally, in case of a 13-bit input, the forms of 3-bit information for a 3-bit Booth multiplier are $\{b_0,b_1,b_2\}$, $\{b_2,b_3,b_4\}$, $\{b_4,b_5,b_6\}$, $\{b_6,b_7,b_8\}$, $\{b_8,b_9,b_{10}\}$, and $\{b_{10},b_{11},b_{12}\}$.

Figure 4:
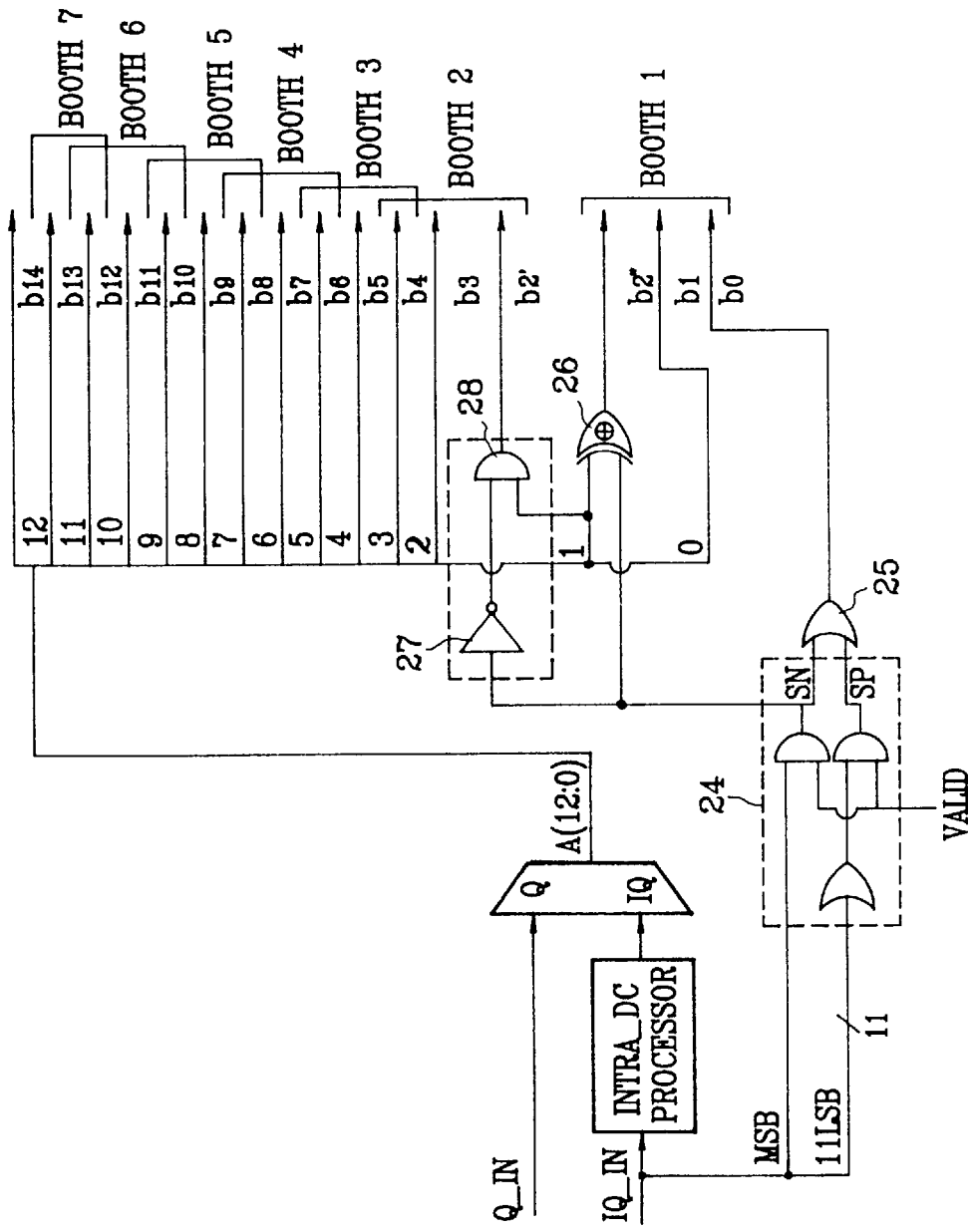
FIG. 4 is a Booth coded additive circuit for a Booth multiplier according to the present invention.

However, as shown in FIG. 4, the present invention generates bit strings $\{b_0,b_1,b_2"\}$, $\{b_2',b_2,b_3\}$, $\{b_3,b_4,b_5\}$, $\{b_5,b_6,b_7\}$, $\{b_7,b_8,b_9\}$, $\{b_9,b_{10},b_{11}\}$ and $\{b_{11},b_{12},b_{(12)}\}$. A circuit for generating $b_0$, $b_2"$ and $b_2'$ is expressed as the following Equation 4, by using 1-bit information SN which indicates whether the input IQ_IN is negative and 1-bit information SP which indicates whether the input IQ_IN is positive.

$b_2'=$(a1) AND (inv(SN))

$b_2"=$(a1) EXOR (SN)

$b_0=$(SN) OR (SP)  [Equation 4]

where a1 denotes bit 1 of A, $b_0$ is achieved by OR gate 25, $b_2"$ is achieved by exclusive OR (EXOR) gate 26l, and $b_2'$ is achieved by inverter 27 and AND gate 28. In the Equation 5, the AND gate means a bitwise-AND operation, the exclusive OR (EXOR) gate means a bitwise-EXOR operation, and the inverter 27 means an inverse value of the 1-bit information SN. The SN is generated through 11-bit OR gate and two AND gates 4.

Figure 5:
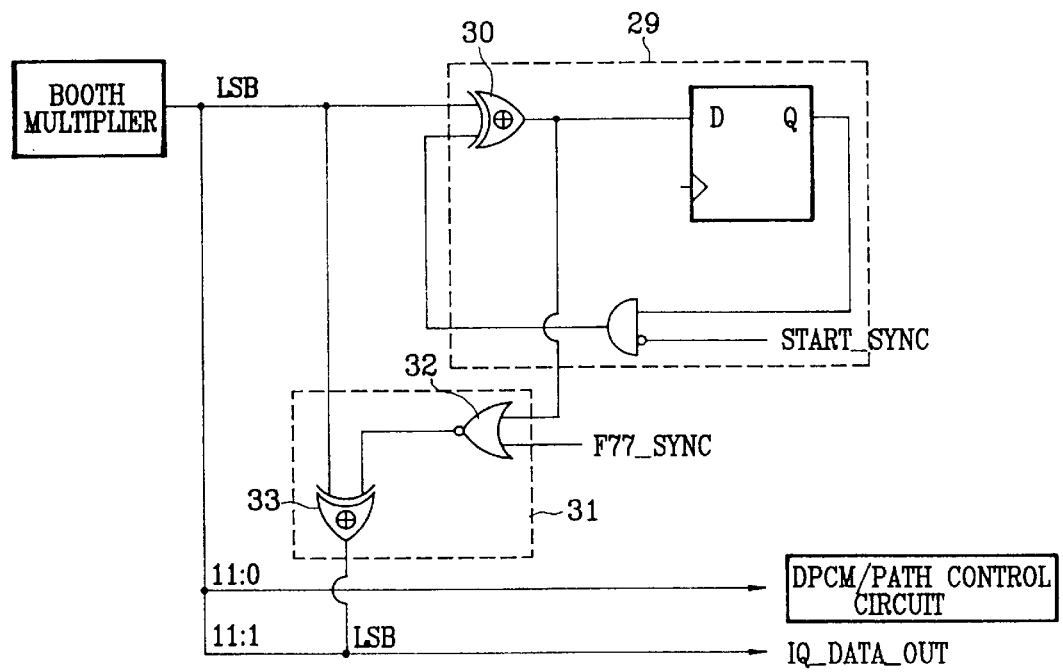
FIG. 5 is a circuit diagram of a mismatch control circuit of a video CODEC standard being MPEG-2.

A mismatch control circuit shown in FIG. 5 is necessary to only the video CODEC standard MPEG-2, and generates a new block F in which a mismatch control is performed according to block information of block F' beford performing the mismatch control. Herein, an algorithm for generating the new block F is as follows:

```
[Part 1]

sum = 0;
    for (u=0; u<8; u++)
[Part 2]

for (v=0; v<8; v++)
        sum = sum + F'[v][u];
    for (v=0; v<7; v++)
        F[v][u] = F'[v][u];
    if (sum=odd) then F[7][7] = F'[7][7];
    else if (F[7][7] = odd) then F[7][7] = F'[7][7] - 1;
    else F[7][7] = F'[7][7] + 1;
    end if;
```

In general, for the above caluclation, whether the sum is an odd number of even number is sensed by addition of all values of F'[v][u]. But the present invention determines whether the sum is an odd number of even number by continously checking a least significant bit (hereinafter referred to as LSB).

The part 1 shown in the above program source is achieved by a block 29 of FIG. 5. That is, the LSB of the Booth multiplier's output value passes through exclusive OR gate 30, and performs an exclusive OR operation with next LSB by next clock. These steps are performed until the end of one block.

The part 2 is achieved by a block 31 of FIG. 5. That is, the signal indicating whether the sum is odd number or even number passes through exclusive OR gate 33 with a signal from NOR gate 32. A synchronization signal F77_SYNC of the last pixel and LSB of the last pixel pass through the NOR gate 32. This step is not performed in other standards excepting the video CODEC standard MPEG-2.

Figure 6:
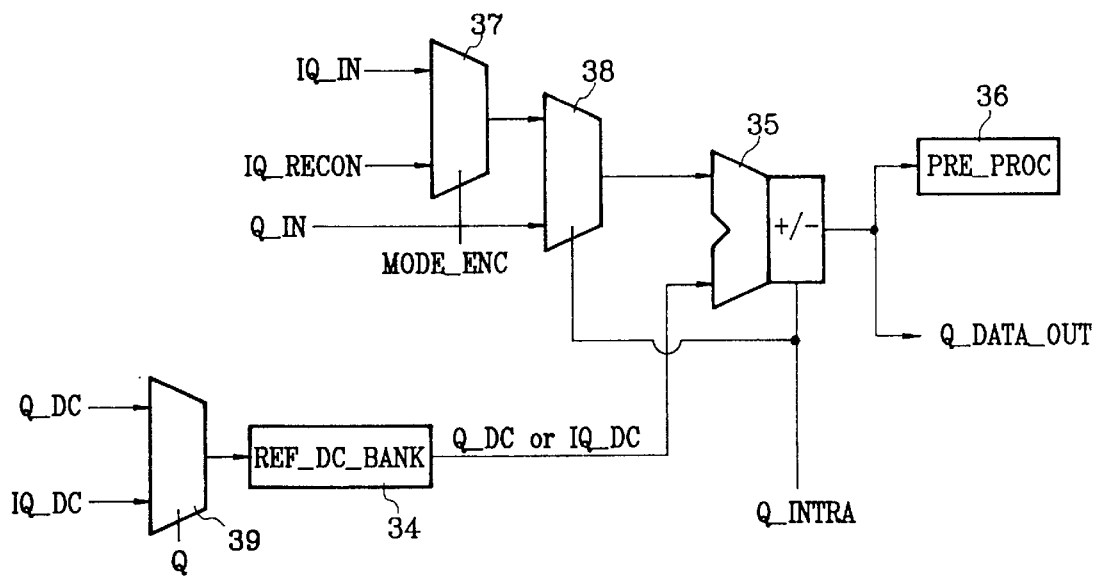
FIG. 6 is an Input/Output circuit diagram of a quantization/inverse quantization circuit including a DPCM according to the present invention.

A DPCM calculates a difference between DC components of blocks. A position of such a DPCM is not defined in the standards, so that the DCPM is positioned where desired by a designer. In the present invention, the DPCM is next to a quantization circuit. In case of the quantization, as shown in FIG. 6, the DPCM reads a previous DC value from REF_DC_BANK portion 34 which stores both the quantized value and DC value of a current block, and performs subtraction in adder 35. In case of the inverse quantization, a current inverse quantization DC input value and a previous inverse quantization DC value are added through the adder 35, and are then inputted to PRE_PROC portion 36 in order to pass through the quantization step. For these operations, REF_DC_BANK 34 for storing a quantization DC and an inverse quantization DC and the adder 35 for performing both addition and subtraction are needed.

A discrimination between a decoded mode and a reconstruction mode is achieved by a selectiong means 37. A discrimination between a coded mode and the result of the selecting means 37 is achieved by another selecting means 38. According to a process mode, addition or subtraction is achieved by the adder 35.

The only DC component among pixel values quantized or inverse quantized is stored in the REF_DC_BANK portion 34 through a selecting means 39, thereby being used later.

As described above, the present invention uses quantization/inverse quantization circuit including DPCM in video CODEC standards (JPEG, H.261, H.263, MPEG-1, and MPEG-2), analyzes a point of sameness and a point of difference among the video CODEC standards, thereby using minimum hardware. In conclusion, the present invention supports all modes (i.e., a quantization mode in coding, an inverse quantization mode in decoding, and a reconstruction mode) by employing one quantization circuit.

In addition, the present invention is a quantization/inverse quantization technique using a DPCM in video CODEC standards (JPEG, H.261, H.263, MPEG-1, and MPEG-2), so it can be used in a video CODEC chip and in a system development.

Although the preferred embodiments of the present invention have been disclosed for illustrative purpose, those skilled in the art will appreciate that various modifications, additions and substitutions are possible, without departing from the scope and spirit of the invention as recited in the accompanying claims.

What is claimed is:

1. A quantization/inverse quantization circuit having a differential pulse code modulator (DPCM) in a video coder-decoder (CODEC), comprising:

an internal direct current (DC) processor which detects that a number '128' is converted to '255' in case of an inverse quantization of video CODEC standards H.261 and H.263 and then reconstructs an original number, or directly passes through other modes without any conversion, in order to quantize a discrete cosine transform (DCT) result in video CODEC standards JPEG, H.261, H.263, MPEG-1, and MPEG-2, to inverse quantize a differential pulse code modulation result or to inverse quantize again the quantized result;

a Booth coded additive circuit which generates an input value of 3 bits necessary to a multiplier in order to perform a 3-bit multiplication;

a Booth multiplier which actually performs a multiplication and a division in quantization/inverse quantization;

a mismatch control circuit which is needed in said video CODEC standard MPEG-2; and a DPC path control circuit which obtains a difference between DC values of data blocks, and includes a selecting means for selecting an input according to a process mode.

2. The quantization/inverse quantization circuit including a DCPM in video CODEC as set forth in claim 1, in order to detect a decimal number '255' from input values in cases of said inverse quantization in said video CODEC standards H.261 and H.263 and then to convert '255' into '128', wherein sdaid internal DC processor checks a mode signal H_I_DC indication said video CODEC standards H.261 and H.263, a sign bit being a most significant bit (MSB) of an input value, and the input value's 8 least significant bits (LSBs), and said input value is regarded as '255' when each of the aformentioned bits is '1';

said internal DC processor masks the 7 LSBs of said 8 LSBs with '0' by activating a 255_ACTIVE signal; and said internal DC processor directly passes said input value therthrough without any conversion in the case of modes other than said video CODEC standards H.261 and H.263.

3. The quantization/inverse quantization circuit including a DPCM in video CODEC as set forth in claim 1, wherein said mismatch control circuit performs an exclusive OR operation between an LSB of an inverse quantization result and a previous LSB through the last result value of a block, and said inverse quantization result is outputted, to discriminate wheter a sum of inverse quantization results of a block is an odd number or an even number in an inverse quantization mode of said video CODEC standard MPEG-2; and when said last result value is '10', said mismatch control circuit performs an exclusive OR operation between a sum of LSBs and a current LSB in order to invert LSB of the last result, and converts a result of said exclusive OR operation into a current output LSB bit value.

4. The quantization/inverse quantization circuit including a DCPM in video CODEC as set forth in claim 1, wherein said quantization/inverse quantization circuit determines an output signal of a first selecting means selected by a MODE_ENC signal from inputs consisting of an output IQ_IN of said DPCM and a quantized output value IQ_RECON;

said quantization/inverse quantization circuit determines an output signal of a second selecting means selected by a Q_INTRA signal from inputs consisting of a result of said first selecting means and a DCT result Q_IN;

said quantization/inverse quantization circuit reads a previous DC component at a position wherein a DC component value corresponding to said QINTRA signal is stored, and performs addition or subtraction using that DC component; and said quantization/inverse quantization circuit supports a third selecting means and said DPCM in quantization and inverse quantization modes, in order to store said DC component value.

* * * * *